United States Patent
Richerson, Jr.

(10) Patent No.: US 10,665,073 B1
(45) Date of Patent: May 26, 2020

(54) FLOATING POOL MONITOR AND ALARM DEVICE

(71) Applicant: Lee C Richerson, Jr., Azusa, CA (US)

(72) Inventor: Lee C Richerson, Jr., Azusa, CA (US)

( * ) Notice: Subject to any disclaimer, the term of this patent is extended or adjusted under 35 U.S.C. 154(b) by 31 days.

(21) Appl. No.: 15/997,549

(22) Filed: Jun. 4, 2018

Related U.S. Application Data

(60) Provisional application No. 62/516,506, filed on Jun. 7, 2017.

(51) Int. Cl.

| G08B 13/196 | (2006.01) |
| E04H 4/06 | (2006.01) |
| G03B 17/08 | (2006.01) |
| G03B 29/00 | (2006.01) |
| G08B 21/08 | (2006.01) |
| H04N 5/225 | (2006.01) |
| H04N 5/232 | (2006.01) |
| H02S 99/00 | (2014.01) |

(52) U.S. Cl.
CPC ......... *G08B 13/19695* (2013.01); *E04H 4/06* (2013.01); *G03B 17/08* (2013.01); *G03B 29/00* (2013.01); *G08B 21/08* (2013.01); *H02S 99/00* (2013.01); *H04N 5/2252* (2013.01); *H04N 5/23238* (2013.01); *H04N 5/23296* (2013.01); *G03B 2217/007* (2013.01)

(58) Field of Classification Search
None
See application file for complete search history.

(56) References Cited

U.S. PATENT DOCUMENTS

| 2004/0092181 A1* | 5/2004 | Porat | B63B 22/24 441/136 |
| 2012/0281083 A1* | 11/2012 | Chivers | G03B 17/02 348/81 |
| 2016/0119065 A1* | 4/2016 | Tobias | G03B 17/08 348/81 |
| 2018/0266134 A1* | 9/2018 | Pichon | E04H 4/1654 |

FOREIGN PATENT DOCUMENTS

CN 105407326 A * 3/2016

* cited by examiner

*Primary Examiner* — Frederick D Bailey
(74) *Attorney, Agent, or Firm* — Plager Schack LLP; Mark H. Plager; Stephen Hallberg

(57) ABSTRACT

A floating pool monitor and alarm device is disclosed with a 360 degree HD camera that captures live pool video and wirelessly transmits it to a mobile device of a pool owner. The device allows for remote monitoring of the pool. The HD camera is enclosed by a transparent dome that is disposed at the bottom of the device, thereby capturing the pool video from an underwater perspective, which allows visibility below the surface of the water down to the bottom of the pool. The mobile device includes a mobile app that displays the live video feed and enables the pool owner to hear audio from the poolside, speak to anyone in or around the pool via a speaker, arm or disarm an alarm, receive alarm notifications, make emergency calls, and view video with night vision to show the pool when light is low.

10 Claims, 4 Drawing Sheets

FLOATING POOL MONITOR AND ALARM DEVICE

CLAIM OF BENEFIT TO PRIOR APPLICATION

This application claims benefit to U.S. Provisional Patent Application 62/516,506, filed Jun. 7, 2017, and entitled "HD 360 degree view camera that floats in your pool transmits live video feed to your smart phone or tablet, HD TV/Internet ready with built in alarm. Solar powered." The U.S. Provisional Patent Application 62/516,506 is incorporated herein by reference.

BACKGROUND

Embodiments of the invention described in this specification relate generally to video monitoring systems, and more particularly, to a floating pool monitor and alarm device with a high definition 360 degree high definition camera (HD camera), wherein the floating pool monitor and alarm device connects wirelessly and transmits live high definition video captured by the HD camera to a receiving mobile device.

Many people own a pool or have a pool located on the property of their home. Examples of pools include, without limitation, in-ground and above-ground swimming pools, hot tubs, etc. A person who owns a pool or who is otherwise responsible for the pool and things that happen in connection with the pool (hereinafter referred to as "pool owner") will generally need to ensure that the pool is safe. Safety around the pool needs to be ensured when the pool owner is both at home and at other locations (not at home). When the pool owner has to leave the pool unattended, anyone or anything could fall into the pool. This presents a safety issue for the pool owner, as evidenced by the many cases of unintentional drownings that happen year after year in unattended/unwatched pools.

Furthermore, safety issues can arise even when the pool owner is present and actively watching the pool. In particular, underwater pool monitoring is often overlooked by pool owners, yet a person can drown when submerged beneath the surface of the pool water. Overview cameras are sometimes installed above ground near pools, but such cameras are typically limited in their usefulness, since looking over a pool does not ensure that the bottom of the pool can be seen. Thus, with no live video feed of what is happening underwater, pool owners cannot ensure safety in and around their pools.

Additionally, pool alarm devices that float on the surface of the pool water or connected to a side wall of the pool cannot show 360 degree views under water. Furthermore, none of the conventional pool monitoring devices (video, alarms, etc.) are able to wirelessly connect to and transmit live video to mobile devices outside of the pool area.

Therefore, what is needed is a way to wirelessly (WiFi or Bluetooth) monitor a pool via a mobile device in order to see underwater live video with the ability to make emergency calls or talk to people at poolside from the mobile device and with the ability to arm and disarm a pool alarm via the mobile device and receive an alarm notification at the mobile device when the alarm is triggered, accompanied by a live stream of pool video to show perpetrators with night vision when ambient light is below a threshold visibility level.

BRIEF DESCRIPTION

A novel floating pool monitor and alarm device is disclosed with a high definition 360 degree high definition camera (HD camera) configured to capture live high definition pool video and to wirelessly connect and transmit the pool video to a mobile device of a pool owner. In some embodiments, the floating pool monitor and alarm device connects wirelessly to the mobile device to transmit the live high definition pool video captured in real time to allow for contemporaneous monitoring of the pool from anywhere. In this way, the floating pool monitor and alarm device allows the pool owner to wirelessly monitor the pool via the mobile device in order to see underwater live video with the ability to make emergency calls, arm or disarm a pool alarm, receive an alarm notification at the mobile device when the alarm is triggered, and talk to people at poolside from the mobile device. In some embodiments, the floating pool monitor and alarm device includes an HD camera that includes night vision recording to show perpetrators or others when ambient light is below a threshold visibility level.

The preceding Summary is intended to serve as a brief introduction to some embodiments of the invention. It is not meant to be an introduction or overview of all inventive subject matter disclosed in this specification. The Detailed Description that follows and the Drawings that are referred to in the Detailed Description will further describe the embodiments described in the Summary as well as other embodiments. Accordingly, to understand all the embodiments described by this document, a full review of the Summary, Detailed Description, and Drawings is needed. Moreover, the claimed subject matters are not to be limited by the illustrative details in the Summary, Detailed Description, and Drawings, but rather are to be defined by the appended claims, because the claimed subject matter can be embodied in other specific forms without departing from the spirit of the subject matter.

BRIEF DESCRIPTION OF THE DRAWINGS

Having described the invention in general terms, reference is now made to the accompanying drawings, which are not necessarily drawn to scale, and wherein.

DETAILED DESCRIPTION

Figure 1:
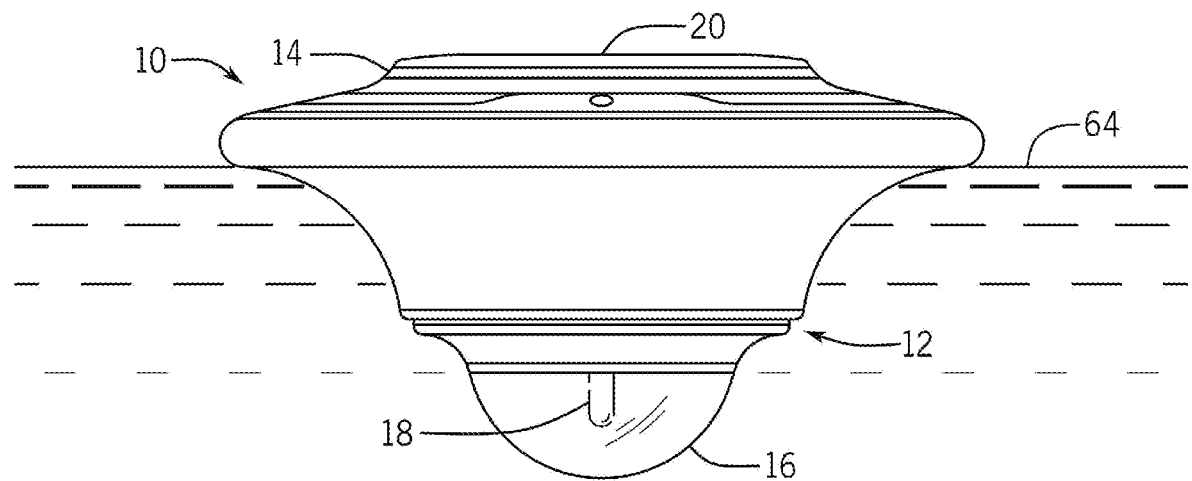
FIG. 1 conceptually illustrates an elevation view of a floating pool monitor and alarm device of some embodiments while in a pool during use.

In the following detailed description of the invention, numerous details, examples, and embodiments of the invention are described. However, it will be clear and apparent to one skilled in the art that the invention is not limited to the embodiments set forth and that the invention can be adapted for any of several applications.

Some embodiments of the invention include a novel floating pool monitor and alarm device with a high definition 360 degree high definition camera (HD camera) configured to capture live high definition pool video and to wirelessly connect and transmit the pool video to a mobile device of a pool owner. In some embodiments, the floating pool monitor and alarm device connects wirelessly to the mobile device to transmit the live high definition pool video captured in real time to allow for contemporaneous monitoring of the pool from anywhere. In this way, the floating pool monitor and alarm device allows the pool owner to wirelessly (WiFi, Bluetooth, etc.) monitor the pool via the mobile device in order to see underwater live video with the ability to make emergency calls, arm or disarm a pool alarm, receive an alarm notification at the mobile device when the alarm is triggered, and talk to people at poolside from the mobile device. In some embodiments, the floating pool monitor and alarm device includes an HD camera that includes night vision recording to show perpetrators or others (animals, children who have fallen in, etc.) when ambient light is below a threshold visibility level.

In some embodiments, the floating pool monitor and alarm device comprises a high definition 360 degree high definition camera (HD camera), a lower body, an upper body, a wireless transceiver device, a rechargeable battery, a solar panel to power the floating pool monitor and alarm device and charge the battery, a universal serial bus (USB) port to charge the battery, a waterproof speaker that outputs alarm and voice audio, and a transparent dome that surrounds the HD camera and includes a water tight seal that ensures the HD camera does not contact water in the pool when the transparent dome is sealed to the lower body with the water tight seal. In some embodiments the USB port is a micro-USB port. In some embodiments, the wireless transceiver device comprises one of a WiFi device and a Bluetooth device.

In some embodiments, the floating pool monitor and alarm device includes a plurality of sensors that aid in operating the floating pool monitor and alarm device to detect water safety issues. In some embodiments, the plurality of sensors comprise an accelerometer that detects motion in the pool. In some embodiments, the floating pool monitor and alarm device includes a global positioning system (GPS) device that is integrated within the floating pool monitor and alarm device to remotely move the floating pool monitor and alarm device to a desired location in the pool. In some embodiments, the GPS device is used to remotely move the floating pool monitor and alarm device to the center of the pool.

With this combination of elements, the floating pool monitor and alarm device of the present disclosure is able to show the bottom of the pool on mobile device via live HD video stream as captured by the 360 degree HD camera, along with providing the waterproof speaker that allows for audible alarms as well as talking and listening to anyone present at the pool site. The 360 degree views included in the streaming video of the bottom of the pool improve upon conventional devices and swimming pool surveillance and security systems which merely look over the pool or sit on the surface of the pool, but which do not show live video underwater with a 360 degree view of the pool. In this way, the floating pool monitor and alarm device of the present disclosure provides the pool owner with simple way to monitor the pool via mobile device with the ability to see underwater live via WiFi or Bluetooth capable mobile app, and to make emergency calls or talk to people at poolside from the mobile device, as well as to arm and disarm the pool alarm via mobile device and to be notified when the alarm is triggered and show corresponding pool video, including night vision capable video.

By way of example, and referring to FIG. 1, which conceptually illustrates an elevation view of a floating pool monitor and alarm device 10 in at least one embodiment while floating on water in a pool and during use. The floating pool monitor and alarm device 10 comprises a lower body 12, an upper body 14, a transparent dome 16, a high definition 360 degree high definition camera (HD camera) 18, and a solar panel 20. In some embodiments, each of the lower body 12 and the upper body 14 is made of ABS plastic material or PC-ABS polycarbonite plastic material. In some embodiments, the transparent dome 16 is made of ABS transparent polished plastic material or PC-ABS polycarbonite plastic material. In some embodiments, the transparent dome 16 is waterproof sealed with a gasket.

As shown in FIG. 1, the floating pool monitor and alarm device 10 floats on water 64 in the pool. The upper body 14 is largely above the surface of water 64 while the lower body 12 is largely submerged beneath the surface of water 64. The HD camera 18 is an electronic component that captures high definition video of the bottom of the pool at any angle within the complete 360 degree circle through the transparent dome 16 and includes night vision capacity to record in low light. The high definition video is recorded at a specific minimum recognized standard for high definition, including 1080p, 720p, or higher standards, such as 4K or ultra-high definition (UHD) video.

Figure 2:
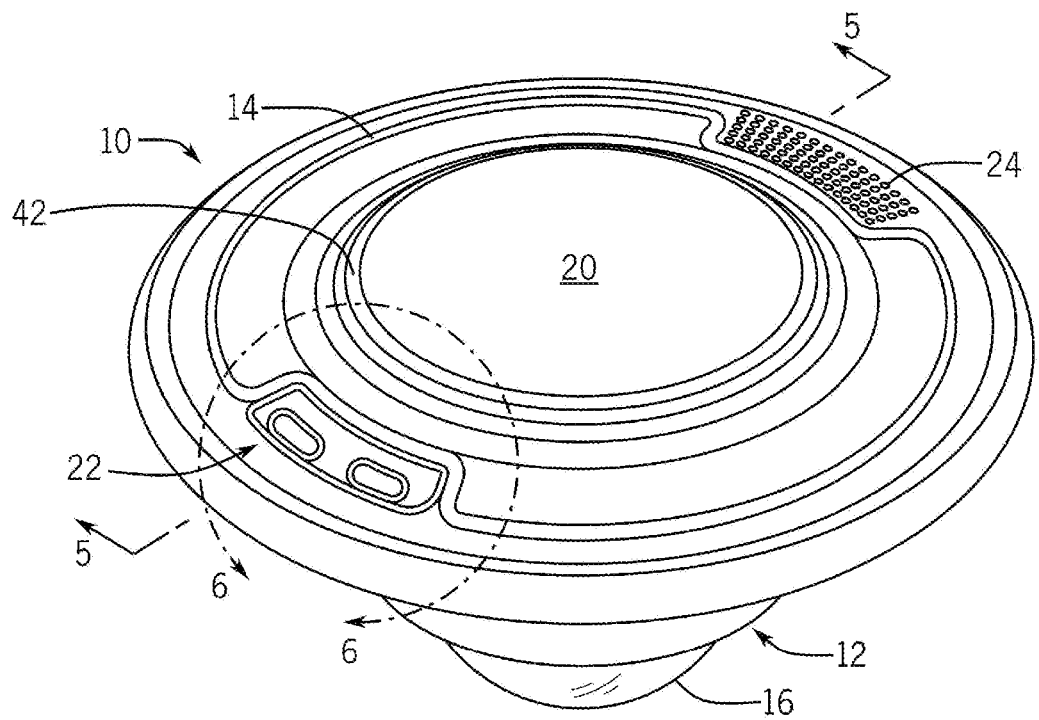
FIG. 2 conceptually illustrates a top perspective view of the floating pool monitor and alarm device in some embodiments.

Now turning to another example, FIG. 2 conceptually illustrates a top perspective view of the floating pool monitor and alarm device 10. As shown in this figure, a control panel 22, a waterproof speaker 24, and a light pipe alarm 42 are disposed along a top surface of the upper body 14. In some embodiments, the waterproof speaker 24 is a 28 mm waterproof electronic component mylar speaker that provides audio output and includes a microphone to capture and transmit audio heard at poolside. In some embodiments, the control panel 22 is made of silicon rubber by an injection mold process and made to specification. The light pipe alarm 42 is a ring shaped electronic component with a light (LED) that connects to an alarm ring and is configured to light up when an alarm is triggered. The LED will flash a color (e.g., red) around a ring that is visible from the top and is positioned proximate to and around the solar panel 20. For example, the LED lights may flash red light that is visible from the top of the floating pool monitor and alarm device 10 and above the surface of the pool water. Internal components and elements of the floating pool monitor and alarm device 10 are described in greater detail below, by reference to FIG. 5. In addition, the control panel 22 is described in greater detail below, by reference to FIG. 6.

Figure 3:
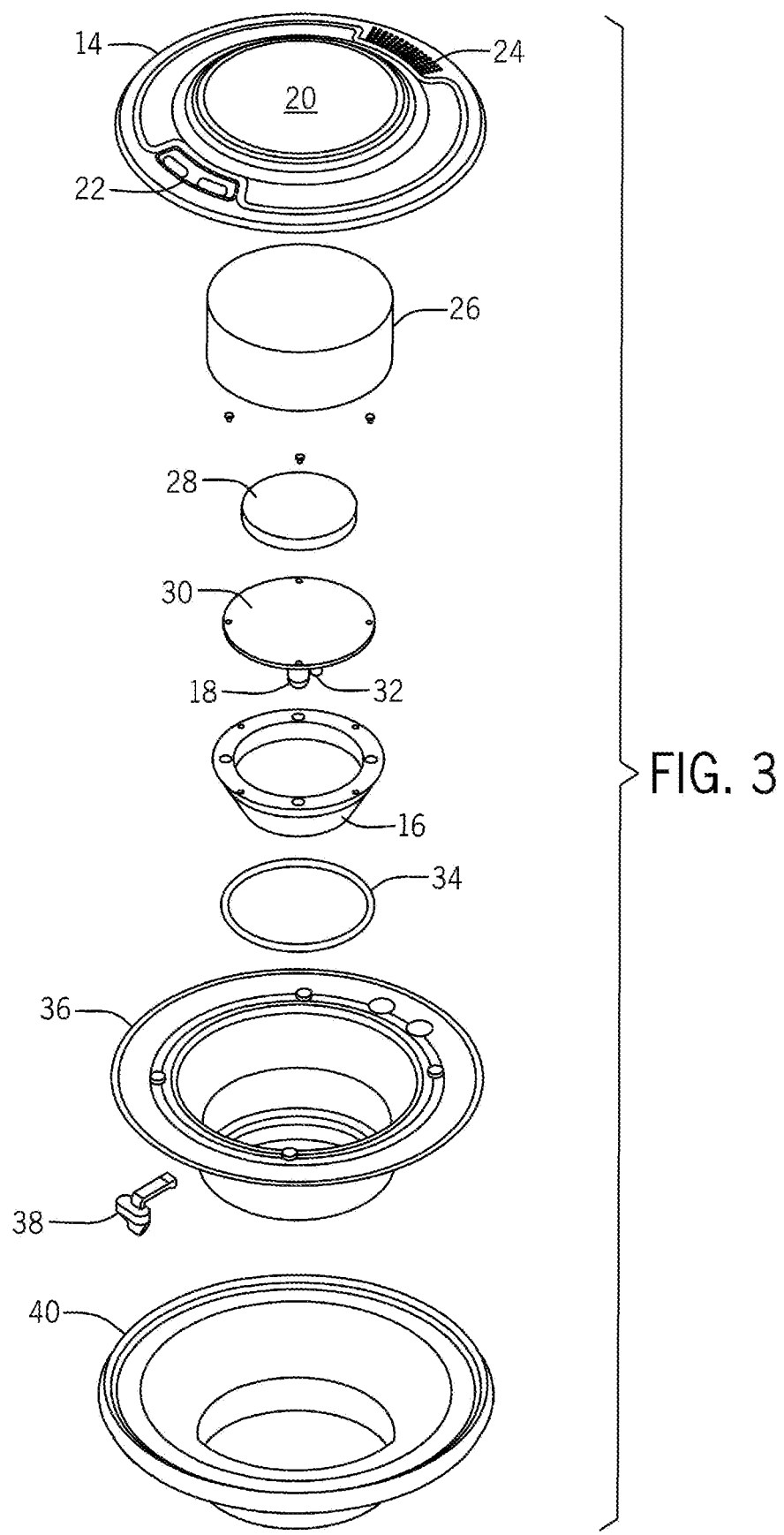
FIG. 3 conceptually illustrates an exploded perspective view of the floating pool monitor and alarm device of some embodiments.

By way of example, FIG. 3 conceptually illustrates an exploded perspective view of the floating pool monitor and alarm device. As shown in this figure, the upper body 14 includes a solar panel 20, as well as the control panel 22 and the waterproof speaker 24. Internal foam 26 made of expanded polystyrene (EPS) is disposed under the upper body 14. A camera PC board 30 is secured to the internal foam 26 by screws, such as plastite screws made of annealed stainless steel or another material, or another type of fastener. A counterweight 28 made of annealed stainless steal is disposed under the internal foam 26 and above the camera printed circuit board 30 (hereinafter referred to as "PC board" or "PCB"). The HD camera 18 and an infrared (IR) sensor 32 connect to an opposing side of the camera PC board 30, thereby providing sufficient visibility of the bottom of the pool for the HD camera 18 and the IR sensor 32, around which the transparent dome 16 is disposed. In some embodiments, plastite screws are used to secure the camera PC board 30 to the internal foam 26 and hold the counterweight 28 in place between the camera PC board 30 and the internal foam 26, and to also secure to the transparent dome 16. In some embodiments, a dome gasket 34 made of silicon rubber cushions the transparent dome 16 covering the HD camera 18 when connected to a bottom enclosure 36, and seals the seam between them to ensure the HD camera 18 and IR sensor 32 remain free of water. In some embodiments, the internal foam 26 has a hollow internal shell which houses components in the bottom enclosure 36 and has no contact with water, thereby ensuring the components in the shell remain free of water contact.

In some embodiments, the solar panel 20 is made of aluminum and plastic. In some embodiments, the solar panel 20 is a waterproof, scratch and UV resistant, high efficiency monocrystaline cell rated at 6V at 330 mA via DC jack connector.

In some embodiments, the counterweight 28 is designed to balance the floating pool monitor and alarm device on the surface of the water in the pool.

A plug 38 covers and prevents water exposure to the USB port along an outer surface of the bottom enclosure 36. In some embodiments, the plug 38 is made of silicon rubber, thereby ensuring that the USB connection to the PCB 30 or micro-USB connection to the PCB 30 (with vertically mounted micro-USB A) is waterproof.

A foam cup 40 with EPS coating to protect the foam cup 40 from chlorine, sun, heat, cold, etc., surrounds the bottom enclosure 36 and provides an outer surface of the lower body 12 of the floating pool monitor and alarm device to protect the electronic components within. As the outer surface of the lower body 12 is coated with EPS, the foam cup 40 provides protection from chlorine and sun (and/or heat, cold, and other weather elements) and slows degradation over time. Additionally, the foam cup 40 is configured to secure the lower body 12 to the upper body 14. In some embodiments, adhering screws with adhesive are used to secure the foam cup 40 to the bottom enclosure 36. The adhering screws are not shown in this figure, but may be injection molded plug screws made of silicon rubber or plastite screws made of annealed stainless steel.

Figure 4:
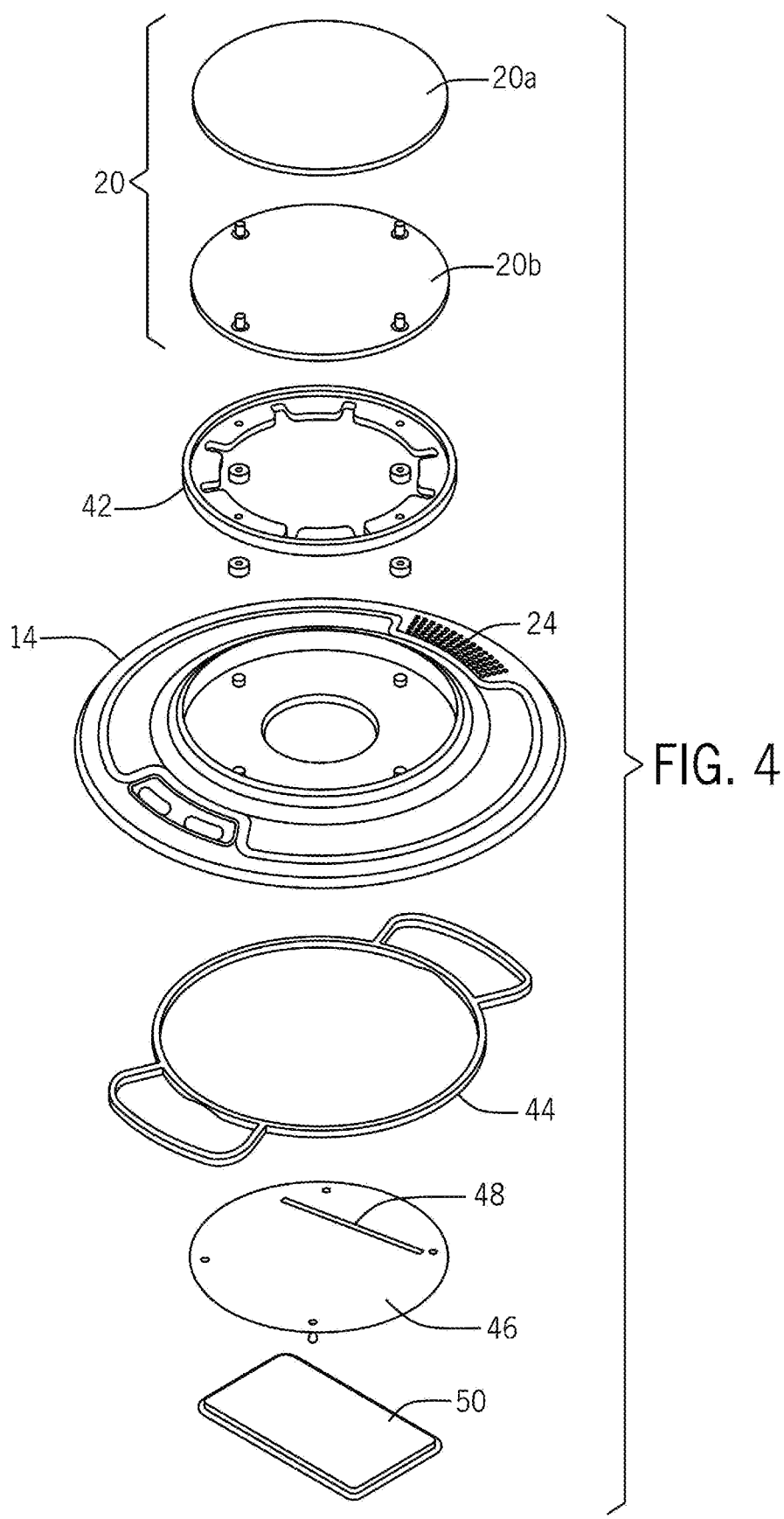
FIG. 4 conceptually illustrates an exploded perspective view of an upper area of the floating pool monitor and alarm device of some embodiments.

Now turning to another detailed example, FIG. 4 conceptually illustrates an exploded perspective view of an upper area of the floating pool monitor and alarm device. As shown in this figure, the solar panel 20 comprises an upper solar panel component 20a and a lower solar panel component 20b. A light pipe alarm 42 is disposed under the lower solar panel component 20b which is screwed to the upper body 14 with the waterproof speaker 24 and control panel 22 exposed at the surface of the upper body 14. In some embodiments, the light pipe alarm 42 is ring shaped electronic component with a light (LED) that connects to the alarm ring and is configured to light up (e.g., in red) in circular fashion around the ring when the alarm is triggered. The LEDs flash colored light (e.g., red) that is visible from the top of the floating pool monitor and alarm device (that is, above the surface of the pool water), thereby providing visual alert of a safety issue or other pool issue.

An upper body gasket 44 fits under the solar panel 20 for a tight seal and is made of silicon rubber to seal the waterproof speaker 24 and the control panel 22 from water exposure internally. The upper body gasket 44 also seals a main PC board 46, an ad hoc WiFi antenna 48, and a battery 50 from water exposure internally. The battery 50 provides backup power when solar power is not sufficiently strong to power the floating pool monitor and alarm device, or for floating pool monitor and alarm devices that are deployed in indoor pools, in which case the battery 50 can be recharged via USB (or micro USB). In some embodiments, the battery 50 is a Li Polymer battery. In some embodiments, the battery 50 is a 6000 mAh Lithium battery. Other types, powers, and capacities of batteries are also anticipated for use. In some embodiments, the ad hoc WiFi antenna 48 lays flat on top enclosure and is an electronic component that is able to connect to the mobile device of the pool owner, so long as the mobile device includes corresponding WiFi circuitry. In some embodiments, other wireless antennae are included instead of, or in combination with, the ad hoc WiFi antenna 48.

Figure 5:
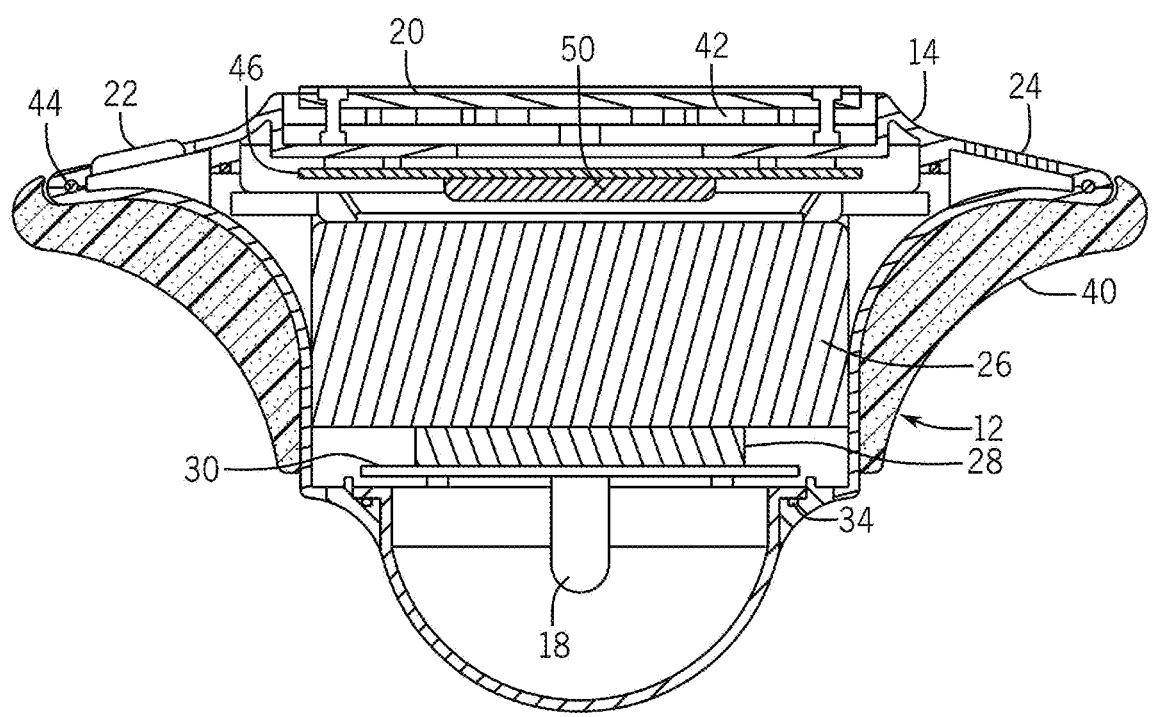
FIG. 5 conceptually illustrates a cross-sectional view of the floating pool monitor and alarm device taken along line 5-5 of FIG. 2.

More internal details are shown by way of example in FIG. 5, which conceptually illustrates a cross-sectional view of the floating pool monitor and alarm device taken along line 5-5 of FIG. 2. Components of the floating pool monitor and alarm device shown in this figure include the lower body 12, the upper body 14, the HD camera 18, the solar panel 20, the control panel 22, the waterproof speaker 24, the internal EPS foam 26, the counterweight 28, the camera PC board 30, the dome gasket 34, the foam cup 40, the light pipe alarm 42, the upper body gasket 44, the main PC board 46, and the battery 50.

Figure 6:
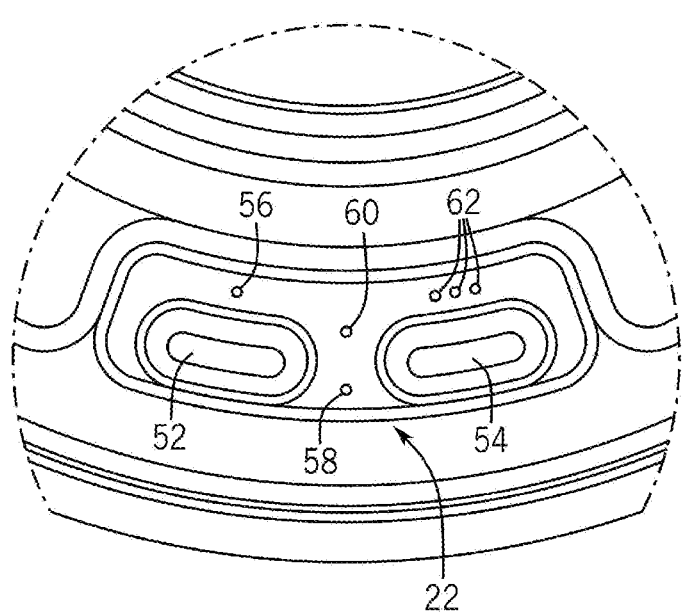
FIG. 6 conceptually illustrates an enlarged detail perspective view indicated by line 6-6 of FIG. 2.

Now turning to another detailed example, FIG. 6 conceptually illustrates an enlarged detail perspective view of the control panel 22 as indicated by line 6-6 of FIG. 2. As shown in this figure, the control panel 22 includes a power button 52, a motion sensitivity button 54, a power indicator 56, a camera indicator 58, an alarm indicator 60, and motion sensitivity indicators 62. In some embodiments, the power button 52 and the motion sensitivity button 54 are tact switches connected to sensors. In some embodiments, each of the power indicator 56, the camera indicator 58, the alarm indicator 60, and the motion sensitivity indicators 62 are SMT LEDs (red color). The SMT LEDs are electronic components that help light up the indicator lights of the control panel 22.

As described above, FIGS. 1-3 and 5 demonstrate the 360 degree field of view of the floating pool monitor and alarm device, by way of the electronic coupling of the camera PC board 30 to the HD camera 18 and the IR sensor 32, and by placement of the HD camera 18 and the IR sensor 32 within the transparent dome 16 to provide unobstructed 360 degree views of the pool inside the water down to the bottom of the pool. In particular, when the IR sensor 32 detects motion in the pool, the camera PC board 30 instructs the HD camera 18 to reorient and refocus to the location in the pool of the detected motion.

The camera PC board 30 is communicatively connected to the main PC board 46. Therefore, as the HD camera 18 captures lives high definition video of the pool around the detected area of motion, the camera PC board receives the high definition video feed and passes it through to the main PC board 46 for wireless transmission as a high definition video stream to the mobile device of the pool owner via the ad hoc WiFi antenna 48, described above by reference to FIG. 4. While the examples described in this specification focus on WiFi wireless communication and data transmission, a person of ordinary skill in the relevant art would appreciate that any of several wireless standards could be employed with corresponding antennae and other hardware/software to enable wireless communication, control, and data transmission between the floating pool monitor and alarm device and the mobile device of the pool owner. For example, the wireless transmission can be based on WiFi, Bluetooth, or other wireless data communication signals and standards including, without limitation, Orthogonal Frequency Division Multiplex (OFDM) or Orthogonal Frequency Division Multiple Access (OFDMA), spread spectrum, Code Division Multiple Access (CDMA), time division multiplexed (TDM), Time Division Multiple Access (TDMA) and Global Mobile System (GSM) processors and baseband filters for providing OFDM, OFDMA, TDM, TDMA, spread spectrum CDMA and GSM system signals, and other such wireless signals and standards.

Furthermore, with the combination of all components and elements shown in FIGS. 1-6, the floating pool monitor and alarm device is able to float at the surface of the water in the pool and show the bottom of the pool in any light condition (bright or dim/dark) on a mobile device of a pool owner/user via live HD video stream as captured by the 360 degree HD camera, along with providing audio communication via the waterproof speaker 24 (e.g., listening to audio around poolside or speaking through the mobile device to pool users) as well as other audio features, such as alarms which are triggered for any of several configurable conditions, and which can be set via the control panel 22 or via the mobile device. In this way, the floating pool monitor and alarm device of the present disclosure provides the pool owner with simple way to monitor the pool via mobile device (smartphone, tablet, etc.) to detect when something or someone has fallen into the water and may be completely submerged. With its ability to capture underwater live video and transmit a the underwater live video as a video stream over WiFi, Bluetooth, or another wireless signal to a mobile app and interface that runs on a mobile processor of the mobile device of the pool owner, the floating pool monitor and alarm device provides safety assurances that were otherwise impossible and which supports other pool safety features, such as emergency calls or live communication to people at poolside from the mobile device, as well as providing local/remote ability to arm and disarm the pool alarm via control panel or mobile device and to be notified when the alarm is triggered and show corresponding pool video, including night vision capable video.

To use the floating pool monitor and alarm device of the present disclosure, one would simply place the floating pool monitor and alarm device on the surface of the pool water and connect to a mobile device (via Bluetooth or direct WiFi) to configure an app running on the mobile device to monitor the pool and receive live high definition video from the device for a pool owner using the mobile device to view from anywhere in the world. The pool owner can also arm or disarm the alarm remotely via the mobile app, such that the alarm will be triggered when something or someone falls in the water of the pool. The pool owner can also talk to anyone at or around the pool or can communicate with paramedics when they arrive at the owner's pool in an effort to save someone or just to tell them to get out of your pool. The pool owner can use the floating pool monitor and alarm device without setting the alarm and just monitor the pool via the high definition pool video feed. Night vision allows the pool owner to see exactly what is happening underwater in your pool when ambient and pool light is low. With HD 360 camera the live video feed is crystal clear. In some embodiments, the floating pool monitor and alarm device includes a unique identifier that allows the floating pool monitor and alarm device to be identified by others who may use the mobile app on a mobile device that is paired to the floating pool monitor and alarm device to monitor the pool. For example, the pool owner may wish to let someone else monitor the pool from their mobile device, such as a baby sitter, a house sitter, a house guest, a dog sitter, etc. In this way, the floating pool monitor and alarm device helps prevent unintentional drownings and other water accidents when a human is not nearby to watch activities in and around the pool.

The above-described embodiments of the invention are presented for purposes of illustration and not of limitation. While these embodiments of the invention have been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

I claim:

1. A floating pool monitor and alarm device with a high definition 360 degree high definition camera (HD camera) configured to capture live high definition pool video when deployed in a pool and to wirelessly connect and transmit the pool video to a mobile device of a pool owner, said floating pool monitor and alarm device comprising:
    an upper body that provides an upper enclosure of the floating pool monitor and alarm device;
    a control panel disposed along a top external surface of the upper body, said control panel comprising a power button, a motion sensitivity button, a power indicator, a camera indicator, an alarm indicator, and a plurality of motion sensitivity indicators, wherein the power button is connected to a power sensor that triggers the power indicator to shine a first light when a first downward force is applied to the power button to turn power on for the floating pool monitor and alarm device;
    a solar panel that is disposed on the top external surface of the upper body and converts sunlight into electric power to operate the floating pool monitor and alarm device;
    a lower body that connects to the upper body to form a single floating device;
    an internal foam layer disposed within the single floating device;
    a counterweight layer disposed within the single floating device under the internal foam layer;
    a camera printed circuit board (camera PC board) that is disposed within the single floating device under the counterweight and is configured to receive signals from sensors and provide instructions based on each received signal;
    an infrared (IR) sensor that is attached to the camera PC board and is configured to detect motion in water of the pool and signal the camera PC board when motion in the water of the pool is detected;
    an HD camera that is attached to the camera PC board and is configured to capture high definition video of the bottom of the pool when the camera PC board provides instructions to record video based on detected motion in the pool; and
    a transparent dome that is disposed at a bottom of the lower body and encloses the HD camera and the IR sensor.

2. The floating pool monitor and alarm device of claim 1, wherein the upper body is oriented to remain largely above a surface of the water of the pool and the lower body is oriented to remain largely submerged beneath the surface of the water of the pool when the floating pool monitor and alarm device floats in the pool water.

3. The floating pool monitor and alarm device of claim 1, further comprising a dome gasket.

4. The floating pool monitor and alarm device of claim 3, wherein the dome gasket waterproof seals the transparent dome tight to the bottom of the lower body to prevent water from contacting the HD camera.

5. The floating pool monitor and alarm device of claim 1, wherein the HD camera includes night vision to record video of the pool when light is low.

6. The floating pool monitor and alarm device of claim 1, further comprising a main PC board disposed above the internal foam layer within the single floating device and a WiFi antenna.

7. The floating pool monitor and alarm device of claim 6, wherein the camera PC board is communicatively connected to the main PC board and is further configured to receive the high definition video of the bottom of the pool captured by the HD camera and transmit the high definition video of the bottom of the pool that is received by the camera PC board to the main PC board for realtime streaming transmission of a live pool video stream to the mobile device of the pool owner via the WiFi antenna.

8. The floating pool monitor and alarm device of claim 1, further comprising a waterproof audio speaker that provides audio output and includes a microphone to capture nearby sound.

9. The floating pool monitor and alarm device of claim 8, further comprising a light pipe alarm, wherein the waterproof audio speaker sounds an audible alarm when a pool alarm is set and triggered by motion detected in the pool and the light pipe alarm lights up an LED when the pool alarm is triggered.

10. The floating pool monitor and alarm device of claim 9, wherein an alarm notification is transmitted to the mobile device of the pool owner when the audible alarm sounds.

* * * * *